(12) United States Patent
Hao et al.

(10) Patent No.: US 7,249,626 B2
(45) Date of Patent: Jul. 31, 2007

(54) HEAT DISSIPATION DEVICE

(75) Inventors: Ming-Liang Hao, Guangdong (CN); Yeu-Lih Lin, Guangdong (CN); Ai-Min Huang, Guangdong (CN); Ming Yang, Guangdong (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 58 days.

(21) Appl. No.: 11/306,357

(22) Filed: Dec. 25, 2005

(65) Prior Publication Data

US 2006/0278374 A1      Dec. 14, 2006

(30) Foreign Application Priority Data

Jun. 10, 2005  (CN) .................... 2005 2 0059960

(51) Int. Cl.
*F28F 1/22*  (2006.01)
*F28D 15/02*  (2006.01)

(52) U.S. Cl. ................... 165/104.33; 165/181

(58) Field of Classification Search ........... 165/104.21, 165/104.26, 104.33, 181, 182; 361/700
See application file for complete search history.

(56) References Cited

U.S. PATENT DOCUMENTS

| | | | | |
|---|---|---|---|---|
| 3,645,330 | A | * | 2/1972 | Albright et al. ............ 165/151 |
| 4,428,419 | A | * | 1/1984 | Dubrovsky et al. ......... 165/151 |
| 5,168,923 | A | * | 12/1992 | Sacks ......................... 165/151 |
| 5,222,550 | A | * | 6/1993 | Griffin et al. ............... 165/151 |
| 5,501,270 | A | * | 3/1996 | Young et al. ............... 165/151 |
| 6,050,328 | A | * | 4/2000 | Shikazono et al. ......... 165/121 |
| 6,938,682 | B2 | | 9/2005 | Chen et al. |
| 2001/0037875 | A1 | * | 11/2001 | Guerrero .................... 165/80.3 |
| 2005/0224214 | A1 | * | 10/2005 | Zeighami et al. ...... 165/104.21 |
| 2006/0266500 | A1 | * | 11/2006 | Lin et al. ............... 165/104.33 |

* cited by examiner

*Primary Examiner*—Teresa J. Walberg
(74) *Attorney, Agent, or Firm*—Winston Hsu

(57) ABSTRACT

A heat dissipation device includes a fin unit (50), and at least a heat pipe (30) including an evaporating section (32) and at least a condensing section (34) extending through the fin unit. The fin unit includes a plurality of fins stacked together. Each fin comprises a wavy and a V-shaped section (52,53) and a planar section (54) therebetween. The wavy and V-shaped sections of the fins can guide an airflow flowing into the fin unit to smoothly flow therethrough, and prevent escape of the airflow from lateral directions of the fin unit. Furthermore, the wavy and V-shaped sections increase the heat dissipation area of the fins and strengthen the fins.

20 Claims, 6 Drawing Sheets

HEAT DISSIPATION DEVICE

FIELD OF THE INVENTION

The present invention relates generally to a heat dissipation device, and particularly to a heat dissipation device for a heat generating electronic device.

DESCRIPTION OF RELATED ART

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the generated heat quickly; thus, a heat dissipation device is often attached on the CPU to efficiently remove the heat generated thereby.

FIG. 6 shows a conventional heat dissipation device 1. The heat dissipation device 1 comprises a fin unit 2, a heat pipe 4 extending through the fin unit 2, and a cooling fan (not shown) for generating an airflow. The fin unit 2 includes a plurality of fins stacked together. Each fin is planar and parallel to each other. A flow channel 3 is formed between two adjacent fins. Each fin defines two through holes therein. The heat pipe 4 is U-shaped. The heat pipe 4 includes an evaporating section for thermally connecting with the CPU and two condensing sections extending upwardly from two opposite ends of the evaporating section, respectively. The condensing sections extend in the through holes of the fins of the fin unit 2 and thermally connect with the fins. The cooling fan is arranged at a front side of the fin unit 2, facing the flow channels 3 thereof.

During operation of the heat dissipation device 1, the working fluid of the heat pipe 4 absorbs the heat generated by the CPU and evaporates into vapor. The vapor moves from the evaporating section to the condensing sections to dissipate the heat to the fins of the fin unit 2. The airflow generated by the cooling fan flows through the flow channels 3 to exchange heat with the fins. Then the heat is dissipated to surrounding environment by the airflow. Thus, heat dissipation of the heat generating device is accomplished.

For enhancing the heat dissipation effectiveness of this heat dissipation device 1, a heat dissipation area of the fin unit 2 needs to be increased. One way to increase the heat dissipation area of the fin unit is to reduce the spacing distance of the adjacent fins so that the fin unit can accommodate more fins. However, this way will increase the weight of the heat dissipation device, which is disadvantageous in view of lightweight requirement of electronic products. Another way is to increase the size of each fin. This way will increase both the weight and size of the heat dissipation device, which is disadvantageous in view of compact requirement of the electronic products. On the other hand, for the planar shape of the fins, a part of the airflow generated by the cooling fan escapes from the fin unit from lateral sides thereof before the airflow reaches a side of the fin unit opposite the cooling fan. This causes the airflow not able to have a sufficient heat exchange with the fins. Therefore, the airflow cannot be sufficiently utilized to dissipate heat absorbed by the fin unit from the heat-generating electronic device. Accordingly, heat dissipation effectiveness of the conventional heat dissipation device 1 is not totally satisfied. Finally, the planar configuration of the fins makes the fins too weak to withstand an impact force acting on the fins by the airflow. The airflow can cause the fins to vibrate and generate noise.

What is needed, therefore, is a heat dissipation device having a high heat dissipation effectiveness by generating an airflow toward a fin unit without lose of the airflow before the airflow sufficiently contacts with fins of the fin unit, and without increasing the size and weigh of the fin unit.

SUMMARY OF INVENTION

According to a preferred embodiment of the present invention, a heat dissipation device comprises a fin unit and at least a heat pipe. The heat pipe comprises an evaporating section and a condensing section extending through the fin unit. The fin unit comprises a plurality of fins stacked together. Each fin comprises two planar sections and a wavy section between the two planar sections. Two V-shaped sections extend laterally outwardly from the planar sections, respectively. By the wavy section and the V-shaped sections, the fins of the fin unit can have an increased heat dissipation area and enhanced strength. Furthermore, the wavy sections and the V-shaped sections of the fins can prevent an airflow through the fin units to escaped from the fin unit from lateral sides thereof. Thus, the fin unit can have a sufficient heat exchange with the airflow to thereby effectively dissipate the heat of the fin unit absorbed from a heat generating device to surrounding environment.

Other advantages and novel features of the present invention will be drawn from the following detailed description of the preferred embodiment of the present invention with attached drawings, in which:

DETAILED DESCRIPTION

Figure 1:
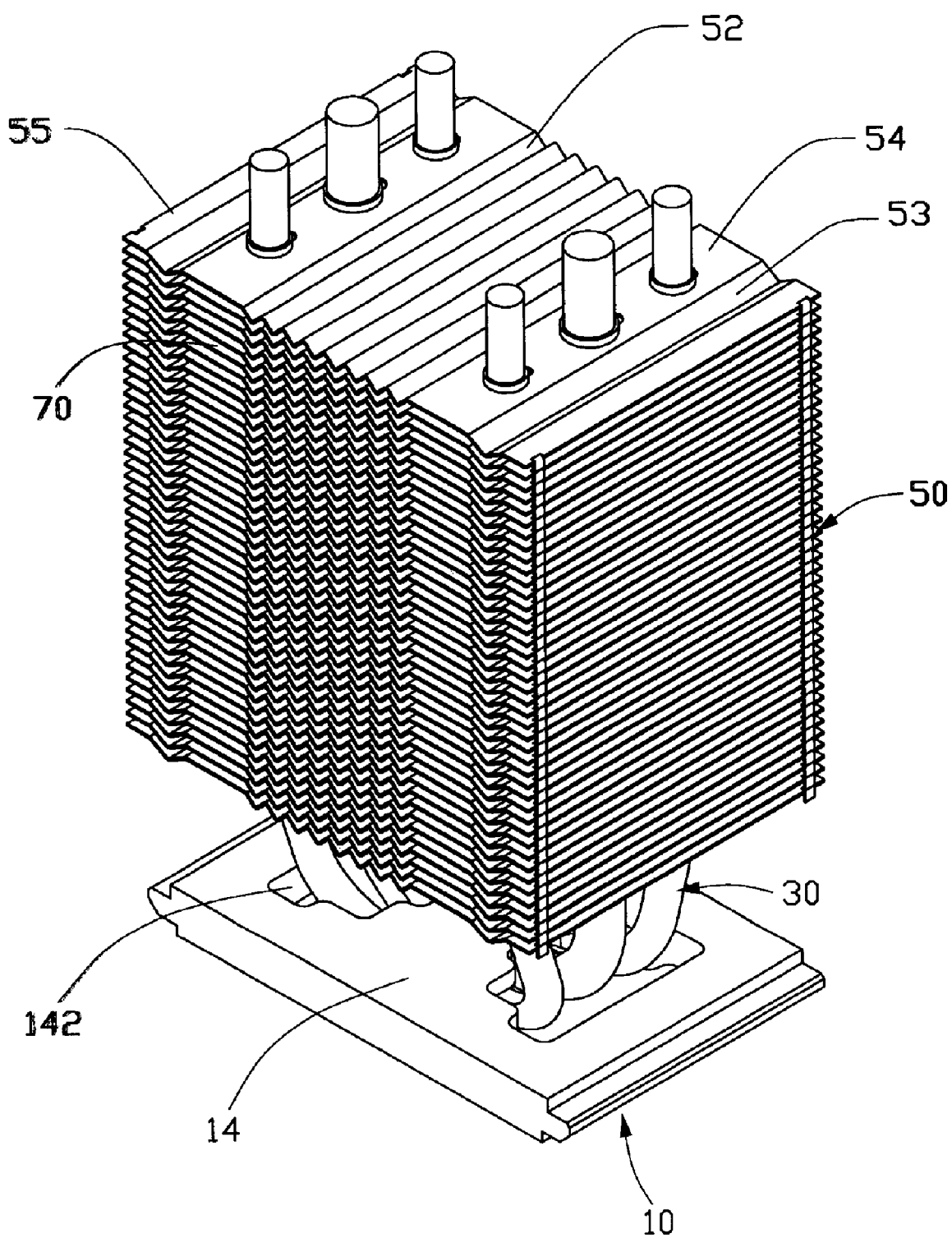
FIG. 1 is an assembled, isometric view of a heat dissipation device in accordance with a preferred embodiment of the present invention.
Figure 2:
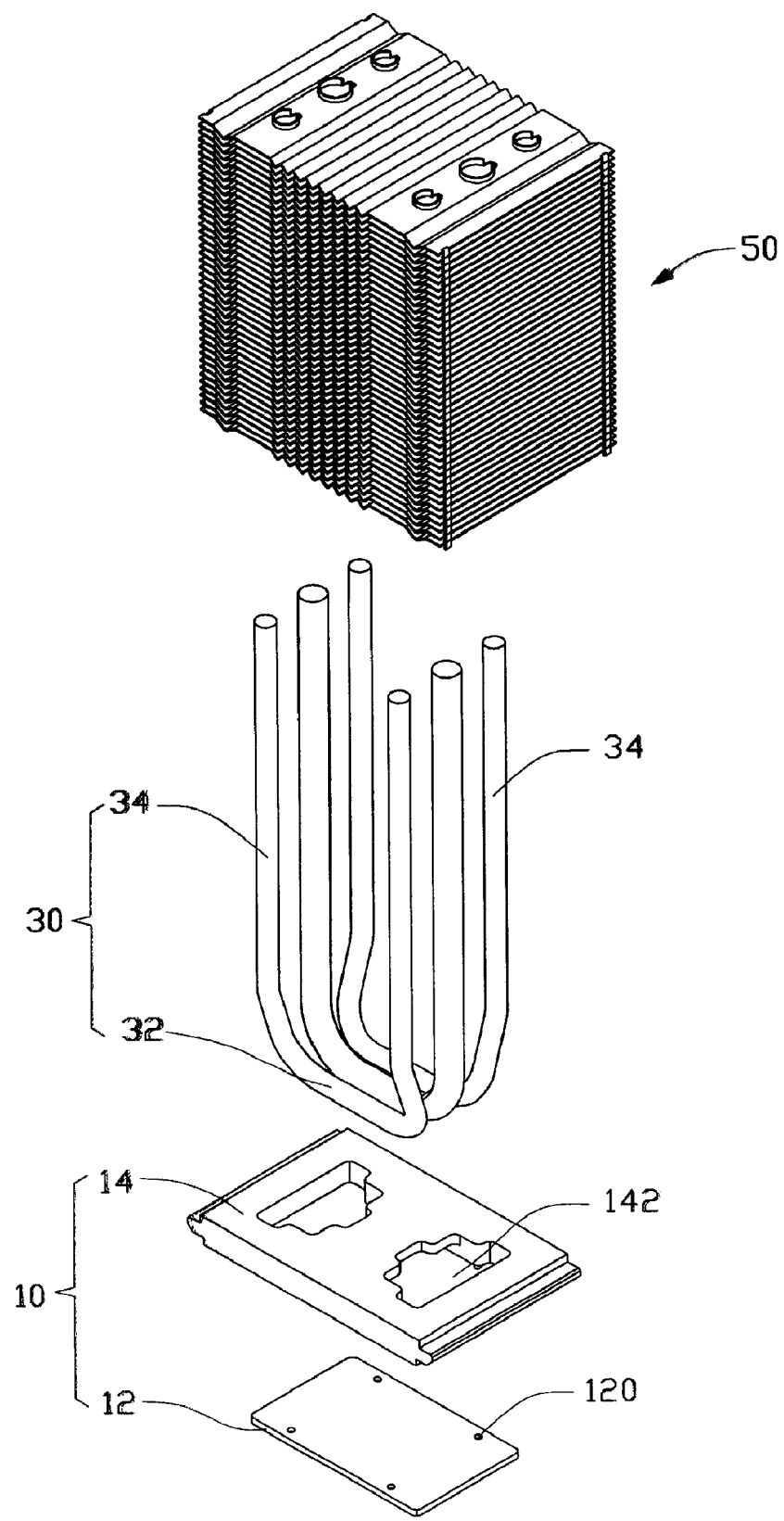
FIG. 2 is an exploded view of the heat dissipation device of FIG. 1.

Referring to FIGS. 1-2, a heat dissipation device according to a preferred embodiment of the present invention comprises a base 10, a fin unit 50, and three heat pipes 30 connecting the base 10 and the fin unit 50.

The base 10 is rectangle-shaped and comprises a bottom wall 12 and a cover 14 mounted on the bottom wall 12. A space is defined between the bottom wall 12 and the cover 14.

Figure 3:
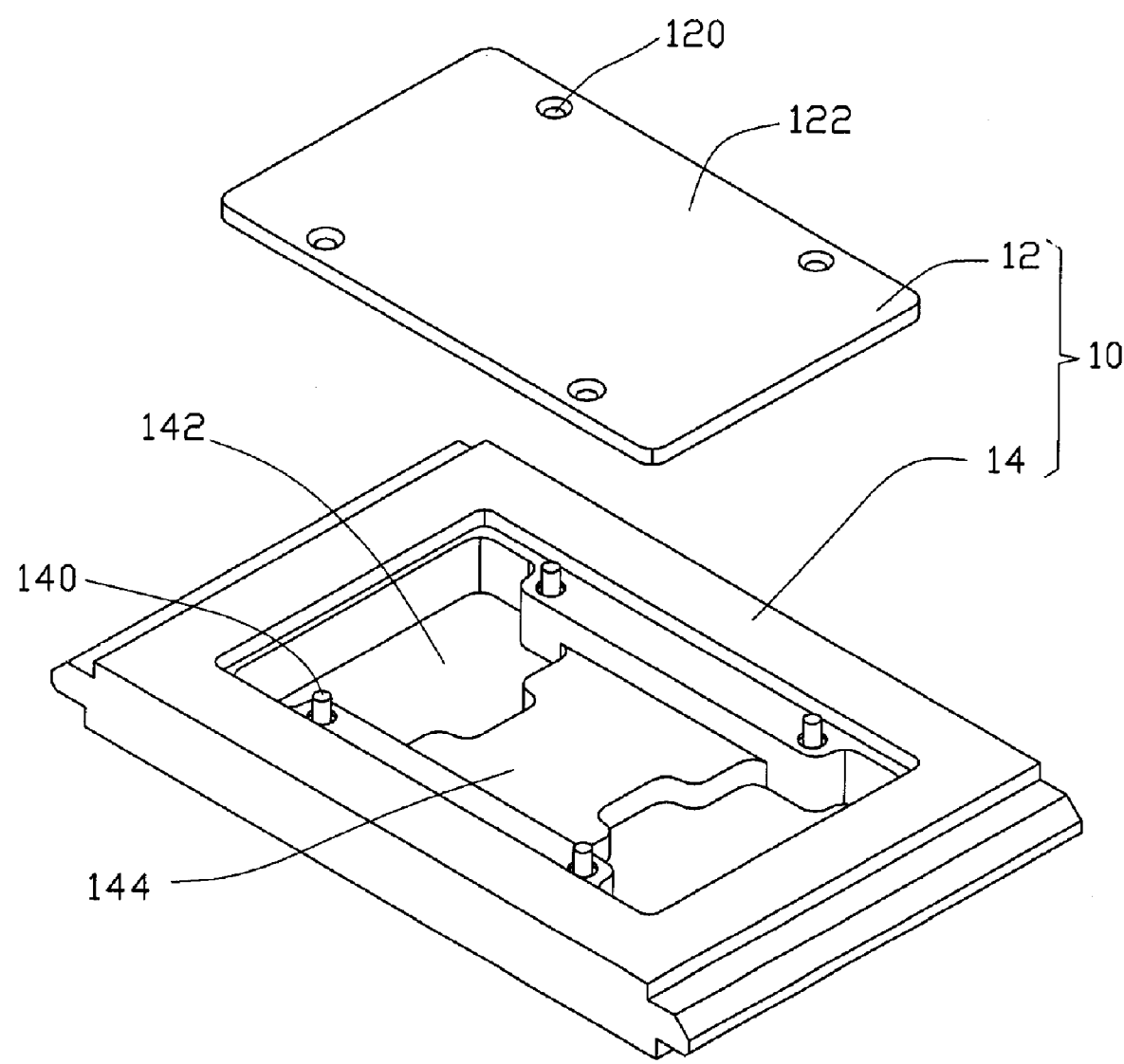
FIG. 3 is an exploded, isometric view of a base of the heat dissipation device viewed from a bottom aspect.

Referring to FIG. 3, the bottom wall 12 is made of a flat metal plate (for example, a copper plate) and has a bottom surface 122 for thermally contacting with a heat generating device, such as a CPU (not shown). Four circular holes 120 are respectively defined in four corners of the bottom wall 12. The cover 14 comprises four poles 140 extending downwardly from a bottom side thereof corresponding to the circular holes 120 of the bottom wall 12. A concave 144 is defined in a lower portion of the cover 14. A pair of openings 142 is defined through the cover 14 near two opposite lateral sides thereof, respectively. The two openings 142 communicate with the concave 144. The concave 144 is located between the two openings 142.

Particularly referring to FIGS. 1-2, each heat pipe 30 is generally U-shaped and comprises an evaporating section 32 and two condensing sections 34 extending upwardly from two opposite ends of the evaporating section 32, respectively. A working fluid (not shown) is received in the heat pipe 30 as a heat carrier when undergoing a phase transition between liquid state and vaporous state. A structure of the heat pipe 30 is well known by those skilled in the art; thus, a detailed explanation thereof is omitted herefrom.

Figure 4:
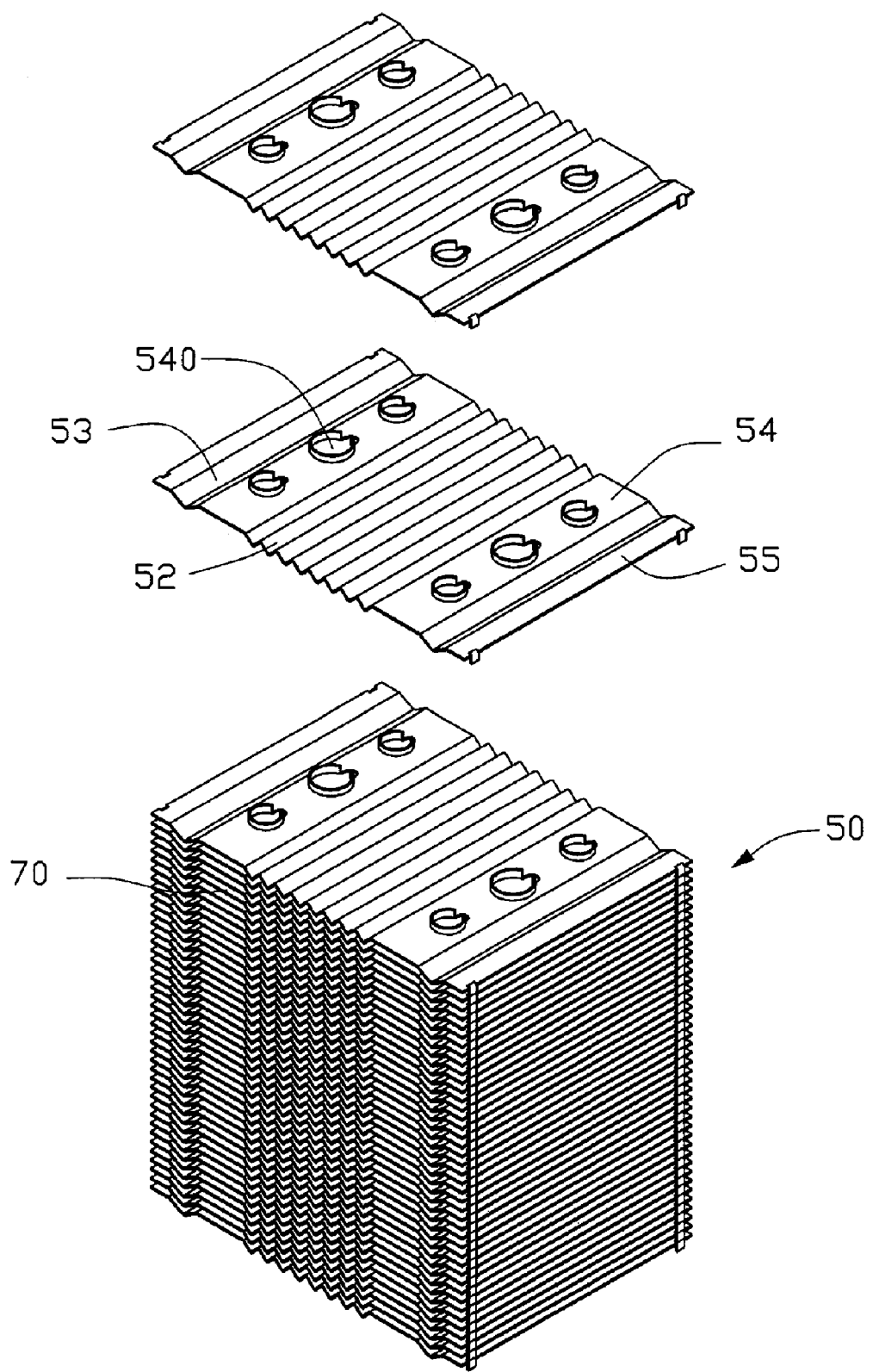
FIG. 4 is an isometric view of a fin unit, with two fins thereof being separated, of the heat dissipation device shown in FIG. 1.
Figure 5:
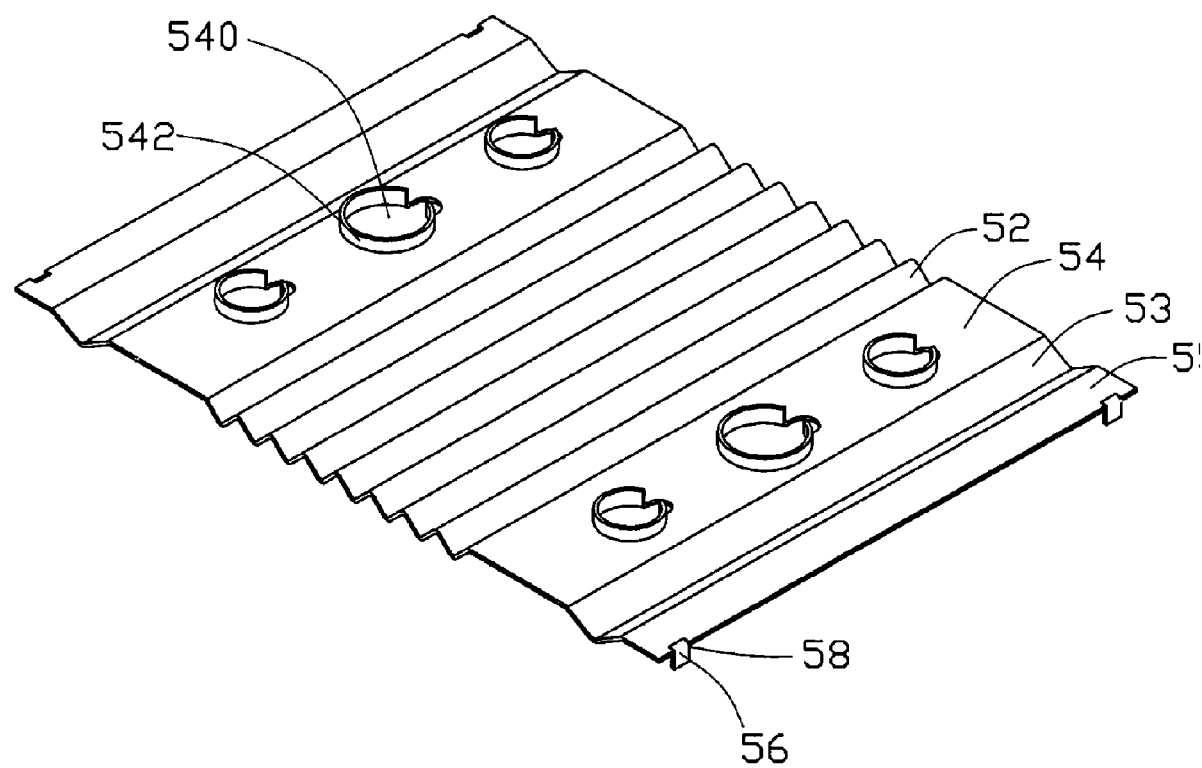
FIG. 5 is an enlarged isometric view of one of the separate fins of the fin unit shown in FIG. 4.
Figure 6:
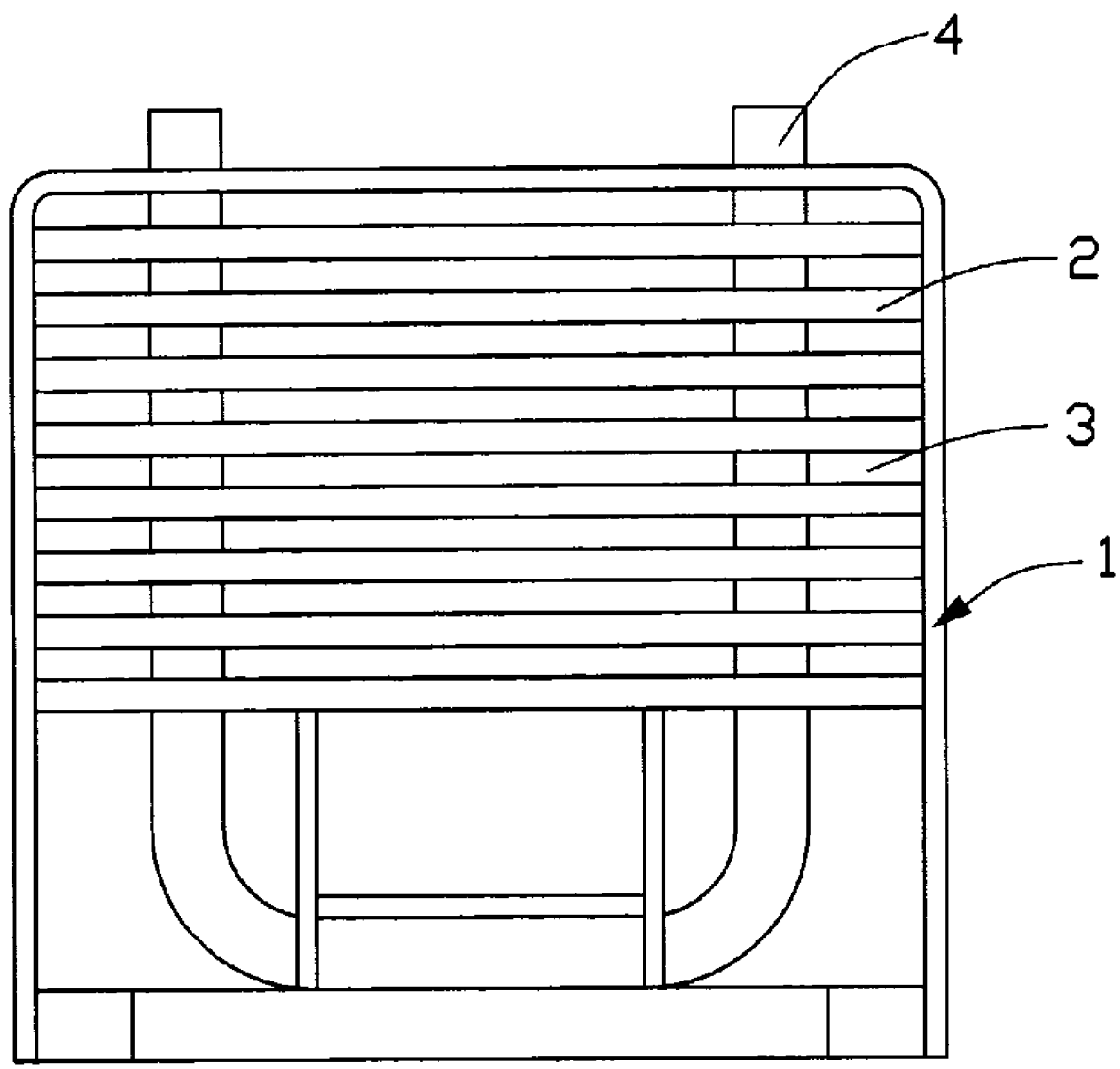
FIG. 6 is a cross-sectional view of a conventional heat dissipation device.

Referring to FIGS. 4-5, the fin unit 50 comprises a plurality of fins horizontally stacked together. A flow channel 70 is formed between two neighboring fins. Each fin comprises a middle wavy section 52, two V-shaped sections 53 located beside two lateral sides of the wavy section 52, respectively, two planar sections 54 each located between the wavy section 52 and a corresponding V-shaped section 53, and two edge sections 55 each extending laterally outwardly from a corresponding V-shaped section 53.

The wavy section 52 is consisted of a plurality of continuous serrations. Each serration defines an included angel of about 60 degrees. The two planar sections 54 extend outwardly from two opposite sides of the wavy section 52. Each planar section 54 defines three through holes 540 for extension of the condensing sections 34 of the heat pipes 30, respectively. A flange 542 extends upwardly from an outer periphery of each of the through holes 540.

The V-shaped sections 53 extend outwardly from two opposite sides of the planar sections 54, respectively. Each of the V-shaped section 53 defines an included angel of approximate 120 degrees.

The two edge sections 55 are arranged at two opposite sides of each of the fins. Each edge section 55 comprises a pair of latches 56 bent downwardly from a lateral edge thereof and defines a pair latching notches 58 in the lateral edge located corresponding to the latches 56, respectively. When stacked together, the fins are arranged horizontally parallel to each other. The flanges 542 of each fin abuts against a bottom face of the planar sections 54 of a neighboring upper fin, whereas the latches 56 of each fin fit in corresponding notches 58 defined in a neighboring lower fin. Thus the fins stacked together and space a distance with each other to define the flow channels 70 therebetween.

The wavy and V-shaped sections 52, 53 of the fins are made by stamping a flat metal sheet. The wavy and V-shaped sections 52, 53 have a thickness which is smaller than that of the planar sections and edge sections 54, 55. Thus, the weight of the fins does not increase, while the heat dissipation area of the fins increases and each fin can have a stronger structure to withstand vibration caused by a forced airflow through the fins. Thus, noise due to vibration of the fins can be lowered.

When assembly, the heat pipes 30 are mounted to the cover 14 by extending the condensing sections 34 of the heat pipes 30 through the openings 142 of the cover 14 from a bottom thereof. Then, each pole 140 of the cover 14 enters into and is fixed in a corresponding circular hole 120 of the bottom wall 12 by soldering. Thus the cover 14 and the bottom wall 12 together define the space for receiving the evaporating sections 32 of the heat pipes 30. Alternatively, the poles 140 can be fixed in the circular holes 120 by other mechanical connection method; for example, the poles 140 are interferingly engaged in the circular holes 120.

The evaporating sections 32 of the heat pipes 30 are received in the space of the base 10 and thermally contact with an upper surface of the bottom wall 12. Each condensing section 34 of the heat pipe 30 extends through a corresponding opening 142 of the cover 14 and into a corresponding through hole 540 of the fin unit 50. The evaporating sections 32 are soldered to the base 10 and the condensing sections 34 are soldered to the flanges 542. Thus the heat dissipation device is assembled together. A cooling fan (not shown) is arranged at a front side of the fin unit 50, facing the flow channels 70 of the fin unit 50. Therefore, when the cooling fan is operated, a forced airflow can flow through the flow channels 70.

During operation of the heat dissipation device, the working fluid of the heat pipes 30 absorbs the heat generated by the heat generating device and evaporates into vapor. The vapor moves from the evaporating sections 32 to the condensing sections 34 to dissipate the heat to the fin unit 50. The airflow generated by the cooling fan flows through the flow channels 70 of the fin unit 50 and exchanges heat with the fins. Thus the heat is dissipated to surrounding environment. The vapor cools and condenses at the condensing sections 34 and then returns to the evaporating sections 32. Thus, heat dissipation of the heat generating device is accomplished.

In the present invention, when the airflow flows through the fin unit 50, the wavy and V-shaped sections 52, 53 of the fin unit 50 can guide the airflow to more smoothly flow through the flow channels 70 of the fin unit 50 from the front side to a rear side thereof. The loss or escape of the airflow from the lateral edges of the fin unit 50 is significantly reduced. Thus the airflow can be sufficiently utilized to exchange heat with the fins. One the other hand, the area of these wavy and V-shaped sections 52, 53 of the fins is larger than that of the planar fins of the prior art. Thus the heat dissipation area of the heat dissipation device of the present invention is increased. Therefore, the heat dissipation effectiveness of the heat dissipation device of the present invention is improved.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat dissipation device comprising:
   a fin unit comprising a plurality of fins stacked together; and
   at least a heat pipe comprising an evaporating section and a condensing section extending through the fin unit;
   wherein each fin comprises a wavy section and a deformed section and a planar section interconnecting the wavy section and the deformed section.

2. The heat dissipation device as described in claim 1, wherein the each fin further comprises an edge section extending outwardly from an outer edge of the deformed section, the deformed section being V-shaped.

3. The heat dissipation device as described in claim 2, wherein the wavy section comprises a plurality of serrate sections, an included angle of each of the serrate sections of the wavy section is smaller than that of the V-shaped deformed section.

4. The heat dissipation device as described in claim 3, wherein the included angle of each of the serrate sections of the wavy section is about 60 degrees, and the included angle of the V-shaped deformed section is about 120 degrees.

5. The heat dissipation device as described in claim 2, wherein the wavy section has a thickness which is smaller than that of the planar section.

6. The heat dissipation device as described in claim 2, wherein the each fin further comprises another V-shaped deformed section and another planar section interconnecting the wavy section and the another V-shaped deformed section.

7. The heat dissipation device as described in claim 6, wherein a thickness of the planar sections is larger than that of the wavy section and the V-shaped deformed sections.

8. The heat dissipation device as described in claim 6, wherein at least a latch is bent downwardly from an outer edge of the each fin, the latch fitting in a neighboring fin.

9. The heat dissipation device as described in claim 1, wherein at least one through hole is defined in the planar section for extension of the condensing section of the at least a heat pipe therethrough.

10. The heat dissipation device as described in claim 1, further comprising a base for thermally contacting with a heat generating device, the base comprising a bottom and a cover, wherein the bottom wall and the cover together define a space therein for receiving the evaporating section of the at least a heat pipe therein.

11. A heat dissipation device comprising:
a fin unit comprising a plurality of fins stacked together; and
at least a heat pipe comprising a evaporating section and a condensing section extending through the fin unit;
wherein each fin comprises a wavy section and a V-shaped deformed section, the wavy section comprises a plurality of serrate sections, an included angle of each of the serrate sections of the wavy section is different from that of the V-shaped deformed section.

12. The heat dissipation device as described in claim 11, wherein the included angle of each of the serrate sections is smaller than that of the V-shaped deformed section.

13. The heat dissipation device as described in claim 12, wherein the included angle of each of the serrate sections is about 60 degrees.

14. The heat dissipation device as described in claim 12, wherein the included angle of the V-shaped deformed section is about 120 degrees.

15. The heat dissipation device as described in claim 11, wherein the each fin further comprises another V-shaped deformed section, the two V-shaped deformed sections being arranged at two opposite lateral sides of the wavy section, respectively, a planar section interconnecting the wavy and a corresponding V-shaped deformed section, the condensing section of the at least a heat pipe extending through the planar section.

16. The heat dissipation device as described in claim 11, wherein the each fin further comprises two edge sections extending outwardly from the V-shaped deformed sections, respectively, the two edge sections each comprising a latch bent from an outer edge thereof, the latch fitting in a neighboring lower fin.

17. A heat dissipation device comprising:
a base having a bottom face for contacting with a heat generating device;
a heat pipe having an evaporating section connected to the base and a condensing section extending upwardly from the evaporating section; and
a plurality of fins connected to the condensing section of the heat pipe, each fin having a middle wavy section and two V-shaped sections each located at a lateral side of the middle wavy section.

18. The heat dissipation device as described in claim 17, wherein each of the V-shaped section defines an included angle of about 120 degrees, and the wavy section includes a plurality of serrations each defining an included angle of about 60 degrees.

19. The heat dissipation device as described in claim 18, wherein the each fin further comprises a planar section interconnecting the wavy section and a corresponding V-shaped section, the condensing section extending through the planar section.

20. The heat dissipation device as described in claim 19, wherein the each fin further comprises an edge section extending outwardly from a corresponding V-shaped section, the edge section forming a downwardly bent latch and a notch at a location corresponding the latch, the latch fitting in the notch of a neighboring fin.

* * * * *